(12) United States Patent
Eldridge et al.

(10) Patent No.: US 7,123,174 B1
(45) Date of Patent: Oct. 17, 2006

(54) IMAGE COMPRESSION AND DECOMPRESSION USING ADAPTIVE RUN LENGTH ENCODING

(75) Inventors: George L. Eldridge, Long Beach, CA (US); Bill P. Gunther, Simi Valley, CA (US); San A. Phong, La Mirada, CA (US); Son Ngoc Nguyen, Irvine, CA (US); Farzin Blurfrushan, Torrance, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/172,245

(22) Filed: Jun. 29, 2005

(51) Int. Cl.
*H03M 7/46* (2006.01)

(52) U.S. Cl. .......................... 341/63; 382/233; 341/50; 341/51

(58) Field of Classification Search ............... 341/63, 341/50, 51; 382/233, 232, 245; 358/1.16, 358/1.15
See application file for complete search history.

(56) References Cited

U.S. PATENT DOCUMENTS

| | | | | |
|---|---|---|---|---|
| 5,754,746 A * | 5/1998 | Blurfrushan et al. | ....... | 358/1.15 |
| 6,078,696 A * | 6/2000 | Nguyen et al. | ............. | 382/253 |
| 6,205,255 B1 * | 3/2001 | Mak | ........................... | 382/245 |
| 6,272,252 B1 * | 8/2001 | Eldridge et al. | ............ | 382/232 |
| 6,307,977 B1 | 10/2001 | Eldridge et al. | ............ | 382/245 |
| 6,317,222 B1 | 11/2001 | Eldridge et al. | ......... | 358/261.1 |
| 6,628,419 B1 * | 9/2003 | So et al. | .................... | 358/1.16 |
| 6,895,119 B1 * | 5/2005 | Hsieh | ....................... | 382/233 |

* cited by examiner

*Primary Examiner*—Jean Bruner Jeanglaude
(74) *Attorney, Agent, or Firm*—Richard H. Kruker; Luis M. Ortiz; Kermit D. Lopez

(57) ABSTRACT

A compressor can compress an image by reducing the amount of data while preserving the information. Some compressors use run length coding wherein image data is converted into a series of run length code words. The efficiency of run length coding can be increased with the introduction of differential run length code words. The differential run length code words can augment the original set of run length codes. Differential run length codes vary from current run length codes by encoding runs of differences.

17 Claims, 4 Drawing Sheets

| Differential Run Length Code Word - 4-bit Long Decrement 601 |||||||||
|---|---|---|---|---|---|---|---|
| 1101 (4 bits) 602 | Hint (4 bits) 303 | Length (2 bytes) 403 | Color (1 byte) 305 | Diff 1 (4 bits) 0 to 15 306 | Diff 2 (4 bits) 0 to 15 307 | ••• | Diff M (4 bits) 0 to 15 404 |

*Fig. 6*

| Differential Run Length Code Word - 4-bit Short Increment/Decrement 701 |||||||||
|---|---|---|---|---|---|---|---|
| 1110 (4 bits) 702 | Hint (4 bits) 303 | Length (1 byte) 304 | Color (1 byte) 305 | Diff 1 (4 bits) 0 to 15 306 | Diff 2 (4 bits) 0 to 15 307 | ••• | Diff N (4 bits) 0 to 15 308 |

*Fig. 7*

| Differential Run Length Code Word - 4-bit Long Increment/Decrement 801 |||||||||
|---|---|---|---|---|---|---|---|
| 1111 (4 bits) 802 | Hint (4 bits) 303 | Length (2 bytes) 403 | Color (1 byte) 305 | Diff 1 (4 bits) 0 to 15 306 | Diff 2 (4 bits) 0 to 15 307 | ••• | Diff M (4 bits) 0 to 15 404 |

*Fig. 8*

IMAGE COMPRESSION AND DECOMPRESSION USING ADAPTIVE RUN LENGTH ENCODING

TECHNICAL FIELD

Embodiments are generally related to date compression. Embodiments are also related to image compression. Embodiments are additionally related to run length coding for image compression and differential coding.

BACKGROUND

When data is generated, it must often be stored or transmitted. Data compression is the art of reducing the amount of data while retaining the information contained within the data. Run length codes are a simple and effective means of data compression. U.S. Pat. No. 6,307,977 and U.S. Pat. No. 6,317,222, both awarded to Eldridge, et. al., disclose run length coding systems and are included here by reference.

An example of run length coded data is "20 Ps" to indicate the letter P repeated 20 times in a row. The data itself is "PPPPPPPPPPPPPPPPPPPP". As can be seen, the coded information is five characters long and occupies 25% of the space of the data.

The Eldridge patents disclose specific run length codes and systems for image compression that enable reducing the amount of data without losing any information. Furthermore, they disclose systems for embedding hints and for selecting between data sources. As such, they also disclose the current methods and systems for run length coding of image data.

Greater data compression than that obtainable using current methods and system is possible and greater compression saves in storage costs and transmission time. A need therefore exists for systems and methods that can compress and decompress an image to a greater extent than current methods and systems allow.

BRIEF SUMMARY

Aspects of the embodiments address limitations and flaws in the prior art by augmenting run length codes, such as those disclosed previously by Eldridge et. al., with differential run length codes.

It is therefore an aspect of the embodiments for an image source to supply image data. The image source is any device capable of producing or storing image data such as a camera, scanner, or computer disk drive. The image data is passed to a compressor that compresses the image data into a series of run length code words. The Eldridge patents disclose eight run length code word typess. Another type of run length code word, a differential run length code word, can also be used. Six differential run length code word types are described below. Therefore, there can be 14 run length code word types of which eight are disclosed in the prior art and six are disclosed here.

The six differential run length code word types and the original eight run length code word types have similar formats. They have a four bit long op-code, a four bit long hint, one or two length bytes, and a color byte. Unlike the original run length codes word types, the differential run length code word types have a series of four bit differential values.

It is also an aspect of the embodiments to obtain a series of run length code words from a first data source and pass them to a decompressor where they are processed to produce image data.

It is a further aspect of the embodiments for a first data source to submit a series of run length code words to a first decompressor and for a second data source to submit a series of run length code words to a second decompressor. The first decompressor produces primary image data and the second decompressor produces secondary image data. As disclosed in U.S. Pat. No. 6,317,222, a third image data is produced by combining the first image data and the second image data. The choice of image data is based on the op-codes in the series of code words from the first data source.

It is a yet further aspect of the embodiments to use printing hints embedded in the op-codes. The printing hints in the differential run length codes are equivalent to those in the original eight run length codes disclosed by Eldridge.

BRIEF DESCRIPTION OF THE DRAWINGS

The accompanying figures, in which like reference numerals refer to identical or functionally similar elements throughout the separate views and which are incorporated in and form a part of the specification, further illustrate the present invention and, together with the background of the invention, brief summary of the invention, and detailed description of the invention, serve to explain the principles of the present invention

FIG. 6 illustrates the 4-bit long decrement differential run length code word type in accordance with an aspect of the embodiments;

FIG. 7 illustrates the 4-bit short increment/decrement differential run length code word type in accordance with an aspect of the embodiments;

FIG. 8 illustrates the 4-bit long increment/decrement differential run length code word type in accordance with an aspect of the embodiments;

DETAILED DESCRIPTION OF THE INVENTION

The particular values and configurations discussed in these non-limiting examples can be varied and are cited merely to illustrate embodiments and are not intended to limit the scope of the invention.

Figure 1:
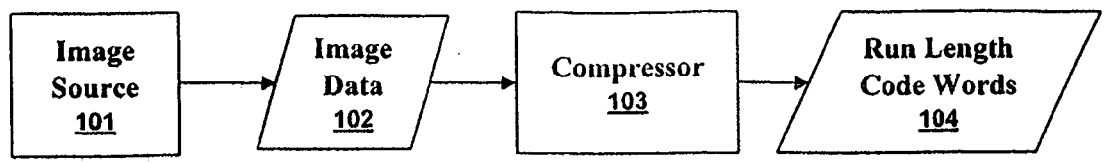
FIG. 1 illustrates a high level block diagram of an image compressor in accordance with an aspect of the embodiments.

FIG. 1 illustrates a high level block diagram of image compression in accordance with an aspect of the embodiments. An image source 101 submits image data 102 to a compressor 103 that produces a series of run length code words 104.

Figure 2:
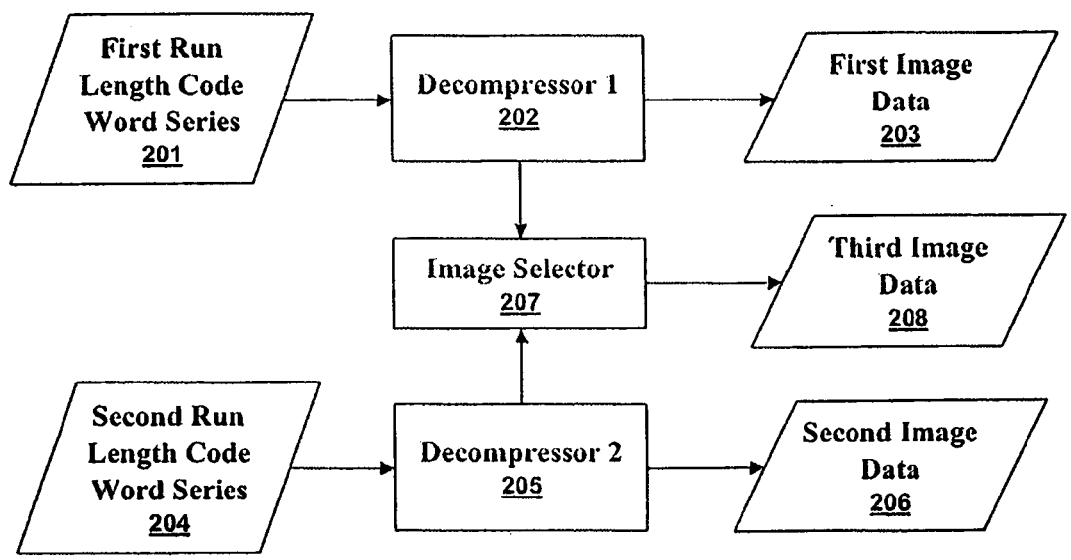
FIG. 2 illustrates a high level block diagram of an image decompressor in accordance with an aspect of the embodiments.

FIG. 2 illustrates a high level block diagram of image decompression in accordance with an aspect of the embodiments. A first series of run length code words 201 is submitted to a first decompressor 202 that can produce a first image data 203. A second series of run length code words 204 is submitted to a second decompressor 205 that can produce a second image data 206. The op-codes in the first series of run length code words 201 can be used to cause an image selector 207 to select, on a pixel by pixel basis, between the data produced by the first decompressor 202 or second decompressor 205 to produce a third image data 208

Figure 3:
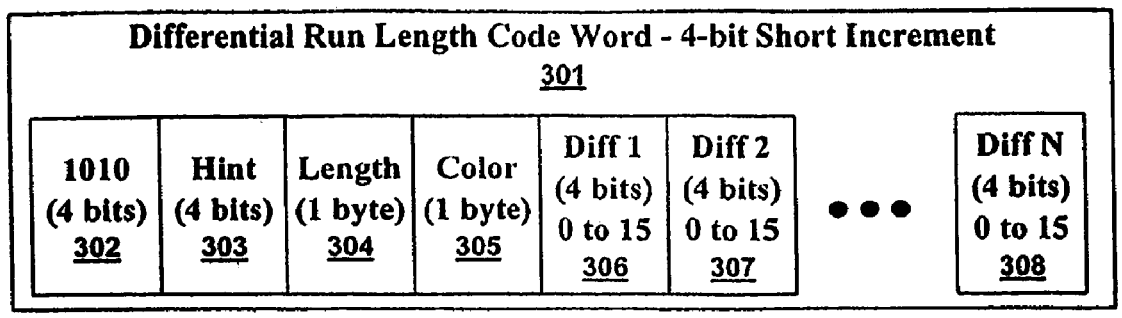
FIG. 3 illustrates the 4-bit short increment differential run length code word type in accordance with an aspect of the embodiments.

FIG. 3 illustrates the 4-bit short increment differential run length code word type 301 in accordance with an aspect of the embodiments. The op-code 302 is shown as the four binary digits "1010" indicating a decimal value of ten and a hexadecimal value of A. The hint 303 is a four bit value. The hint can be a printing directive, display directive, or any other kind of directive or hint that can improve the rendering, display or understanding of the image. A single length byte 304, where a byte is an eight bit value encodes the length of the run associated with the run length code word. A single length byte can encode a value ranging from two to 255. The color byte indicates the color. The rest of the code word is four bit differential values taking a value of 0 to 15 as indicated by the first difference 306, second difference 307, and Nth difference 308. N is a number that is less than 255.

Consider the code word, in hexadecimal, "A5 05 A0 01 23". The op-code, "A" indicates 4-bit short increment. "5" is the hint that can be used elsewhere. "05" indicates the run length is 5 pixels. "A0" is the first pixel value. The first differential "0" indicates the second pixel is A0+0=A0. The second differential "1" indicates the third pixel is A1+1=A2. The third differential "2" indicates the fourth pixel is A2+2=A4. The fourth differential "3" indicates the fifth pixel is A4+3=A7.

Figure 4:
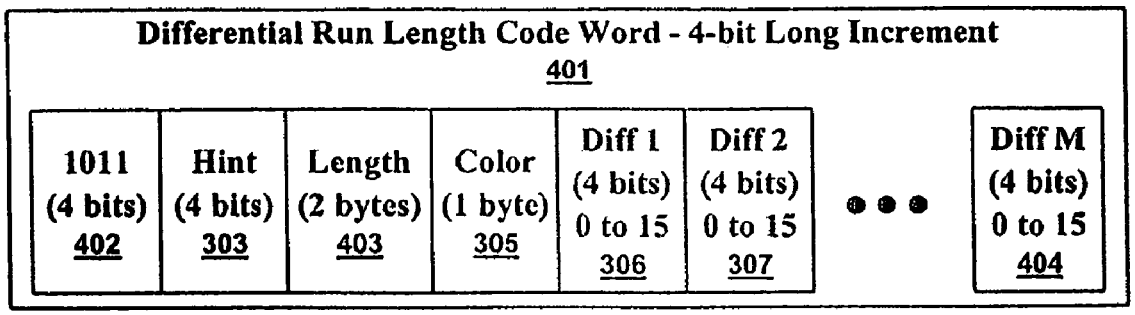
FIG. 4 illustrates the 4-bit long increment differential run length code word type in accordance with an aspect of the embodiments.

FIG. 4 illustrates the 4-bit long increment differential run length code word type 401 in accordance with an aspect of the embodiments. The op-code 402 is shown as the four binary digits "1011" indicating a decimal value of eleven and a hexadecimal value of B. The difference between 4-bit long increment and 4-bit short increment is that there are two length bytes 403. As such, the length of the runs and the number of differential values ranges from 256 to 65535. The last differential in the code word 404 is the Mth where M is less than 65536 and more than 255.

Figure 5:
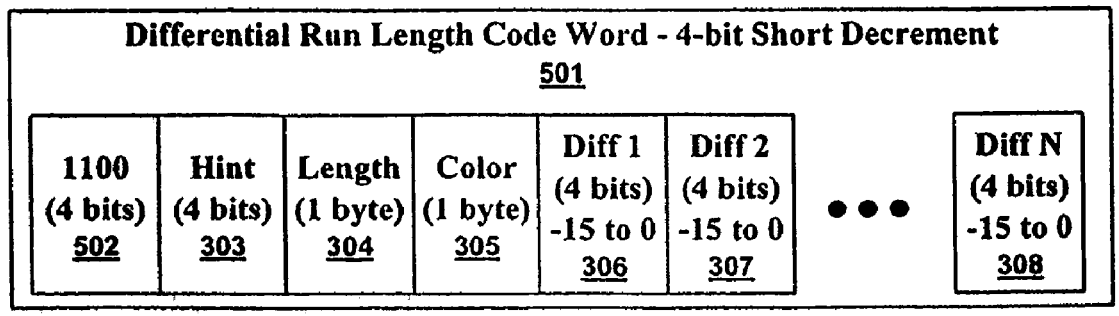
FIG. 5 illustrates the 4-bit short decrement differential run length code word type in accordance with an aspect of the embodiments.

FIG. 5 illustrates the 4-bit short decrement differential run length code word type 501 in accordance with an aspect of the embodiments. The op-code 502 is shown as the four binary digits "1100" indicating a decimal value of twelve and a hexadecimal value of C. The difference between 4-bit short decrement and 4-bit short increment is that the differential values range from –15 to 0.

Consider the code word, in hexadecimal, "C5 05 A0 01 23". The op-code, "C" indicates 4-bit short decrement. "5" is the hint that can be used elsewhere. "05" indicates the run length is 5 pixels. "A0" is the first pixel value. The first differential "0" indicates the second pixel is A0−0=A0. The second differential "1" indicates the third pixel is A0−1=9F. The third differential "2" indicates the fourth pixel is 9F−2=9D. The fourth differential "3" indicates the fifth pixel is 9D−3=9A.

FIG. 6 illustrates the 4-bit long decrement differential run length code word type 601 in accordance with an aspect of the embodiments. The op-code 602 is shown as the four binary digits "1101" indicating a decimal value of thirteen and a hexadecimal value of D. The difference between 4-bit long decrement and 4-bit short decrement is that there are two length bytes 403. As such, the length of the runs and the number of differential values ranges from 256 to 65535.

FIG. 7 illustrates the 4-bit short increment/decrement differential run length code word type 701 in accordance with an aspect of the embodiments. The op-code 702 is shown as the four binary digits "1110" indicating a decimal value of fourteen and a hexadecimal value of E. The difference between 4-bit short increment/decrement and 4-bit short increment is that the differential values range from −8 to 7.

Consider the code word, in hexadecimal, "E5 05 A0 01 FE". The op-code, "E" indicates 4-bit short increment/decrement. "5" is the hint that can be used elsewhere. "05" indicates the run length is 5 pixels. "A0" is the first pixel value. The first differential "0" indicates the second pixel is A0+0=A0. The second differential "1" indicates the third pixel is A0+1=A1. The third differential "F" indicates the third difference is −1 and the fourth pixel is A1−1=A0. The fourth differential "E" indicates the fourth difference is −2 and the fifth pixel is A0−2=9E.

FIG. 8 illustrates the 4-bit long increment/decrement differential run length code word type 801 in accordance with an aspect of the embodiments. The op-code 802 is shown as the four binary digits "1111" indicating a decimal value of fifteen and a hexadecimal value of F. The difference between 4-bit long increment/decrement and 4-bit short increment/decrement is that there are two length bytes 403. As such, the length of the runs and the number of differential values ranges from 256 to 65535.

Figure 9:
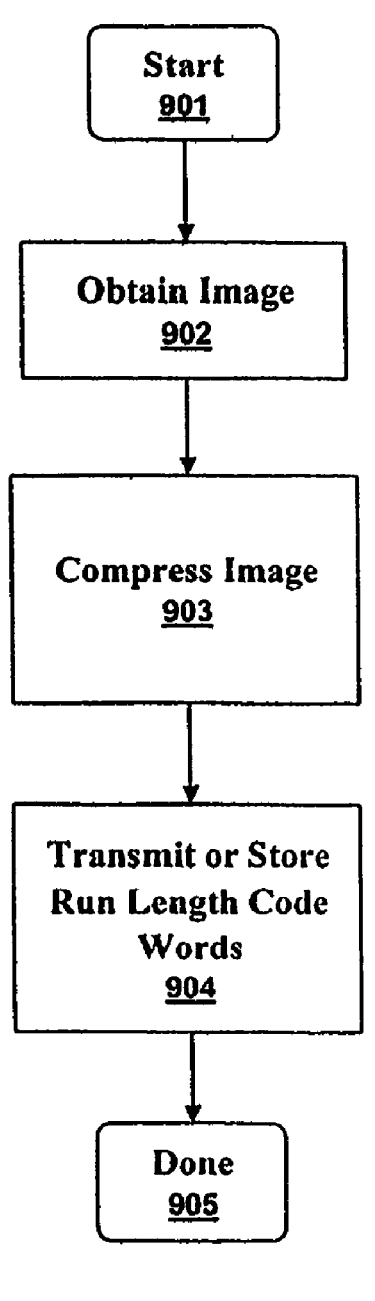
FIG. 9 illustrates a high level flow diagram for compressing an image in accordance with an aspect of the embodiments.

FIG. 9 illustrates a high level flow diagram for compressing an image in accordance with an aspect of the embodiments. After the start 901 an image is obtained 902 and compressed 903 into a series of run length code words. The run length code words can be transmitted or stored 904 before the process is done 905.

Figure 10:
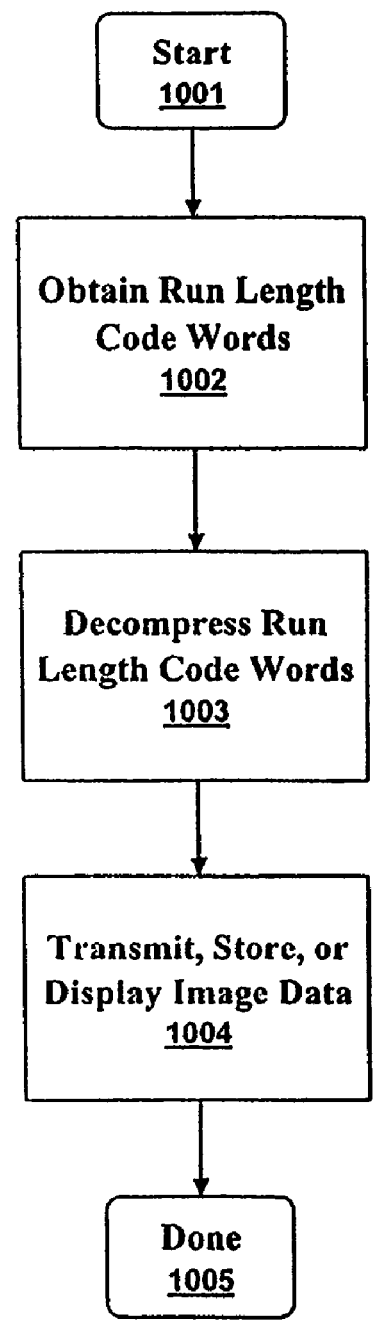
FIG. 10 illustrates a high level flow diagram for compressing an image in accordance with an aspect of the embodiments.

FIG. 10 illustrates a high level flow diagram for compressing an image in accordance with an aspect of the embodiments. After the start 1001 a series of run length code words is obtained 1002 and decompressed 1003 to produce image data. The image data can be transmitted, stored, or displayed 1004 before the process is done 1005. The image data can be used in other ways such as printing, overlaying another image, edited or changed.

Advantageous image compression can be obtained using a subset of the run length codes for compressing image data. For example, the original eight run length codes augmented by the 4-bit short increment/decrement and 4-bit short increment/decrement differential run length codes can be used.

Embodiments can be implemented in the context of modules. In the computer programming arts, a module can be typically implemented as a collection of routines and data structures that performs particular tasks or implements a particular abstract data type. Modules generally can be composed of two parts. First, a software module may list the constants, data types, variable, routines and the like that can be accessed by other modules or routines. Second, a software module can be configured as an implementation, which can be private (i.e., accessible perhaps only to the module), and that contains the source code that actually implements the routines or subroutines upon which the module is based.

Thus, for example, the term module, as utilized herein generally refers to software modules or implementations thereof. Such modules can be utilized separately or together to form a program product that can be implemented through signal-bearing media, including transmission media and recordable media.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A system comprising:
   an image source providing image data;
   a compressor that transforms the image data into at least one run length code word comprising at least one differential run length code word;
   an op-code within each of the at least one differential run length code word wherein the op-code is four bits long and has a value ranging from 10 to 15;
   a hint within each of the at least one differential run length code word wherein the hint is four bits long and used to direct print processing;
   one or two length bytes within each of the at least one differential run length code word wherein the number of length bytes is specified by the op-code;
   a color within each of the at least one differential run length code word wherein the color is one byte long; and
   a multitude of differential values wherein the number of differential values is specified by the one or two length bytes, the interpretation of the differential values is specified by the op-ode, and each of the multitude of four bit differential values is four bits long.

2. The system of claim 1 wherein the op-code of at least one differential run length code word is 10 thereby specifying one length byte, at least 2 but no more than 255 differential values and also specifying that each of the multitude of differential values is interpreted as an integer ranging from 0 to 15.

3. The system of claim 1 wherein the op-code of at least one differential run length code word is 11 thereby specifying two length bytes, at least 256 but no more than 65535 differential values and also specifying that each of the multitude of differential values is interpreted as an integer ranging from 0 to 15.

4. The system of claim 1 wherein the op-code of at least one differential run length code word is 12 thereby specifying one length byte, at least 2 but no more than 255 differential values and also specifying that each of the multitude of differential values is interpreted as an integer ranging from −15 to 0.

5. The system of claim 1 wherein the op-code of at least one differential run length code word is 13 thereby specifying two length bytes, at least 256 but no more than 65535 differential values and also specifying that each of the multitude of differential values is interpreted as an integer ranging from −15 to 0.

6. The system of claim 1 wherein the op-code of at least one differential run length code word is 14 thereby specifying one length byte, at least 2 but no more than 255 differential values and also specifying that each of the multitude of differential values is interpreted as an integer ranging from −8 to 7.

7. The system of claim 1 wherein the op-code of at least one differential run length code word is 15 thereby specifying two length bytes, at least 256 but no more than 65535 differential values and also specifying that each of the multitude of differential values is interpreted as an integer ranging from −8 to 7.

8. The system of claim 1 wherein at least one of the run length code word specifies a second data source.

9. A system comprising:
   a first data source providing at least one first source run length code word;
   a decompressor that transforms the at least one first source run length code word into image data wherein the at least one first source run length code word comprises at least one differential run length code word;
   an op-code within each of the at least one differential run length code word wherein the op-code is four bits long and has a value ranging from 10 to 15;
   a hint within each of the at least one differential run length code word wherein the hint is four bits long and used to direct print processing;
   one or two length bytes within each of the at least one differential run length code word wherein the number of length bytes is specified by the op-code;
   a color within each of the at least one differential run length code word wherein the color is one byte long; and
   a multitude of differential values wherein the number of differential values is specified by the one or two length bytes, the interpretation of the differential values is specified by the op-code, and each of the multitude of four bit differential values is four bits long.

10. The system of claim 9 wherein the op-code of at least one differential run length code word is 10 thereby specifying one length byte, at least 2 but no more than 255 differential values and also specifying that each of the multitude of differential values is interpreted as an integer ranging from 0 to 15.

11. The system of claim 9 wherein the op-code of at least one differential run length code word is 11 thereby specifying two length bytes, at least 256 but no more than 65535 differential values and also specifying that each of the multitude of differential values is interpreted as an integer ranging from 0 to 15.

12. The system of claim 9 wherein the op-code of at least one differential run length code word is 12 thereby specifying one length byte, at least 2 but no more than 255 differential values and also specifying that each of the multitude of differential values is interpreted as an integer ranging from −15 to 0.

13. The system of claim 9 wherein the op-code of at least one differential run length code word is 13 thereby specifying two length bytes, at least 256 but no more than 65535 differential values and also specifying that each of the multitude of differential values is interpreted as an integer ranging from −15 to 0.

14. The system of claim 9 wherein the op-code of at least one differential run length code word is 14 thereby specifying one length byte, at least 2 but no more than 255 differential values and also specifying that each of the multitude of differential values is interpreted as an integer ranging from −8 to 7.

15. The system of claim 9 wherein the op-code of at least one differential run length code word is 15 thereby specifying two length bytes, at least 256 but no more than 65535 differential values and also specifying that each of the multitude of differential values is interpreted as an integer ranging from −8 to 7.

16. The system of claim 9 further comprising a second data source supplying at least one second source run length code word and wherein the at least one second source run length code word can contain at least one differential run length code word and wherein the op-code of each of the first source run length code word can specify the data source supplying valid image data.

17. A method comprising:

compressing an image into at least one run length code word wherein the at least one run length code word comprises at least one differential run length code word;

decompressing at least one run length code word into an image wherein the at least one run length code word comprises at least one differential run length code word;

wherein each of the at least one differential run length code word comprises an op-code having four bits, a hint having four bits, a number of length bytes, a color byte, and at least 2 differential values wherein the op-code specifies the number of length bytes wherein the number of length bytes is one or two;

wherein the op-code specifies the interpretation of the at least two differential values; and wherein the length bytes specify the number of differential values.

* * * * *